(12) United States Patent
Yoneda et al.

(10) Patent No.: US 11,310,910 B2
(45) Date of Patent: Apr. 19, 2022

(54) RESIN COMPOSITION, COPPER FOIL WITH RESIN, DIELECTRIC LAYER, COPPER CLAD LAMINATE SHEET, CAPACITOR ELEMENT AND PRINTED WIRING BOARD WITH BUILT-IN CAPACITOR

(71) Applicant: MITSUI MINING & SMELTING CO., LTD., Tokyo (JP)

(72) Inventors: Yoshihiro Yoneda, Ageo (JP); Toshifumi Matsushima, Ageo (JP); Toshihiro Hosoi, Ageo (JP); Kenshiro Fukuda, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 16/493,531

(22) PCT Filed: Mar. 9, 2018

(86) PCT No.: PCT/JP2018/009327
§ 371 (c)(1),
(2) Date: Sep. 12, 2019

(87) PCT Pub. No.: WO2018/168718
PCT Pub. Date: Sep. 20, 2018

(65) Prior Publication Data
US 2020/0008298 A1   Jan. 2, 2020

(30) Foreign Application Priority Data
Mar. 14, 2017 (WO) .................. PCT/JP2017/010221

(51) Int. Cl.
*H05K 1/03* (2006.01)
*B32B 15/04* (2006.01)
(Continued)

(52) U.S. Cl.
CPC ......... *H05K 1/0373* (2013.01); *B32B 15/043* (2013.01); *B32B 15/20* (2013.01);
(Continued)

(58) Field of Classification Search
CPC ........ H05K 1/0373; H05K 1/09; H05K 1/162; H05K 2201/0209; B32B 15/043;
(Continued)

(56) References Cited

U.S. PATENT DOCUMENTS

| 2004/0147658 A1* | 7/2004 | Matsushima | ........... C08L 63/00 524/436 |
| 2007/0207337 A1 | 9/2007 | Nagatani | |
| 2013/0101857 A1* | 4/2013 | Arita | ................... H05K 1/0326 428/418 |

FOREIGN PATENT DOCUMENTS

| CN | 102443138 | 5/2012 |
| JP | 2003-292733 A | 10/2003 |

(Continued)

OTHER PUBLICATIONS

ISR issued in International Pat. Appl. No. PCT/JP2018/009327, dated Jun. 5, 2018, with English translation.
(Continued)

*Primary Examiner* — Frank J Vineis
*Assistant Examiner* — Laura B Figg
(74) *Attorney, Agent, or Firm* — Greenblum & Bernstein, P.L.C.

(57) ABSTRACT

A resin composition for use in a dielectric layer of a capacitor device or a capacitor-embedded printed circuit board is provided in which the resin composition can improve stability in capacitance and insulation properties of the capacitor device under high temperature and high humidity and ensures high adhesion of the dielectric layer to the device. The resin composition comprises a resin com-
(Continued)

ponent and a dielectric filler. The resin component comprises an epoxy resin, an active ester resin, and an aromatic polyamide resin.

10 Claims, 1 Drawing Sheet

(51) Int. Cl.
*B32B 15/20* (2006.01)
*C08L 63/04* (2006.01)
*C08L 77/00* (2006.01)
*H01G 4/12* (2006.01)
*H01G 4/14* (2006.01)
*H05K 1/09* (2006.01)
*H05K 1/16* (2006.01)

(52) U.S. Cl.
CPC ............... *C08L 63/04* (2013.01); *C08L 77/00* (2013.01); *H01G 4/1227* (2013.01); *H01G 4/14* (2013.01); *H05K 1/09* (2013.01); *H05K 1/162* (2013.01); *B32B 2255/06* (2013.01); *B32B 2255/26* (2013.01); *B32B 2264/102* (2013.01); *B32B 2307/204* (2013.01); *B32B 2457/08* (2013.01); *B32B 2457/16* (2013.01); *C08L 2205/03* (2013.01); *H05K 2201/0209* (2013.01)

(58) Field of Classification Search
CPC . B32B 15/20; B32B 2255/06; B32B 2255/26; B32B 2264/102; B32B 2307/204; B32B 2457/08; B32B 2457/16; C08L 63/04; C08L 77/00; C08L 2205/03; H01G 4/1227; H01G 4/14
See application file for complete search history.

(56) References Cited

FOREIGN PATENT DOCUMENTS

| | | | |
|---|---|---|---|
| JP | 2004-277460 | A | 10/2004 |
| JP | 4148501 | B2 | 9/2008 |
| JP | 2010-285594 | A | 12/2010 |
| JP | 2014-034580 | A | 2/2014 |
| JP | 2016-156019 | A | 9/2016 |
| TW | 2004003297 | A | 3/2004 |
| TW | 2016039921 | A | 11/2016 |
| WO | 2005/087489 | A1 | 9/2005 |
| WO | 2009/008471 | A1 | 1/2009 |
| WO | 2010/087526 | A1 | 8/2010 |
| WO | 2016/114030 | A1 | 7/2016 |

OTHER PUBLICATIONS

Written Opinion issued in International Pat. Appl. No. PCT/JP2018/009327, dated Jun. 5, 2018, with English translation.
IPRP issued in International Pat. Appl. No. PCT/JP2018/009327, dated Sep. 17, 2019 (English translation).
Taiwanese Office Action, Taiwanese Patent Office, Patent Application No. 107108396, dated Dec. 14, 2018, with English translation.

* cited by examiner

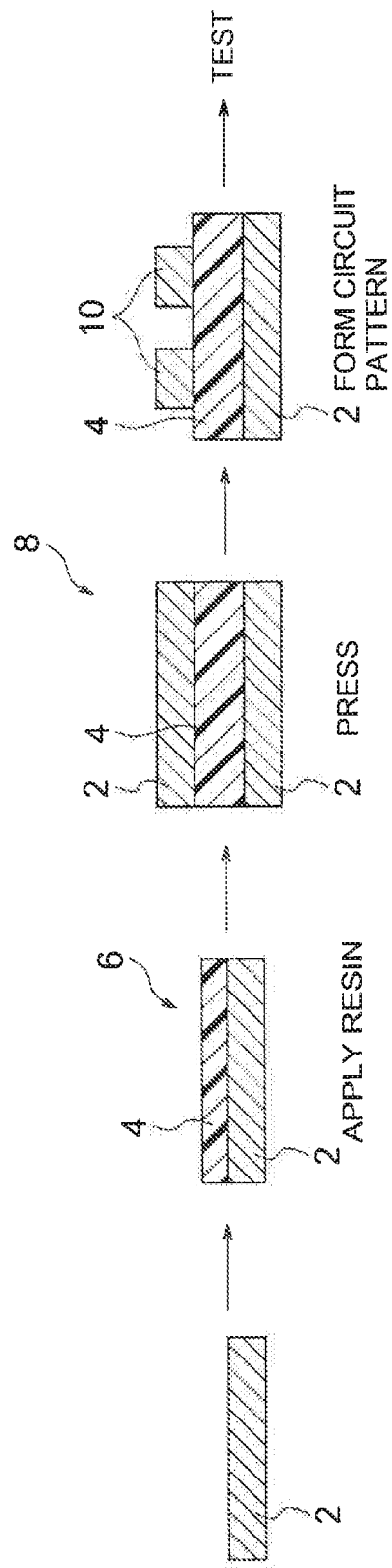

RESIN COMPOSITION, COPPER FOIL WITH RESIN, DIELECTRIC LAYER, COPPER CLAD LAMINATE SHEET, CAPACITOR ELEMENT AND PRINTED WIRING BOARD WITH BUILT-IN CAPACITOR

TECHNICAL FIELD

The present invention relates to a resin composition, a resin-coated copper foil, a dielectric layer, a copper-clad laminate, a capacitor device, and a capacitor-embedded printed circuit board.

BACKGROUND ART

Resin compositions for capacitor-embedded printed circuit boards are known for production of copper-clad laminates or printed circuit boards. Such resin compositions function as dielectric layers of capacitors after being cured. For example, PTL 1 (JP4148501B) discloses a resin composition for capacitor-embedded printed circuit boards. The composition comprises 20 to 80 parts by weight of epoxy resin and 20 to 80 parts by weight of aromatic polyamide resin based on 100 parts by weight of resin component; and 75 to 85 wt % dielectric filler based on 100 wt % resin composition. PTL 2 (WO20091008471) discloses another resin composition for capacitor-embedded printed circuit boards. The composition comprises 25 to 60 parts by weight of epoxy resin, 28 to 60 parts by weight of active ester resin, and 1 to 20 parts by weight of poly(vinyl acetal) resin based on 100 parts by weight of resin component; and 65 to 85 wt % dielectric filler based on 100 wt % resin composition.

Another resin composition is known that has a low dielectric loss tangent after being cured and can reduce smears in via holes alter punching and roughening of the cured product. For example, PTL 3 (JP2016-156019A) discloses a resin composition comprising (A) an epoxy resin, (B) an active ester compound, (C) a smear inhibitory component, and (D) an inorganic filler. The content of (B) the active ester compound is 5 mass % or more based on 100 mass % non-volatile component contained in resin composition. The content of (C) the smear inhibitory component is 0.001 to 10 mass % and the content of (D) the inorganic filler is 70 mass % or more based on 100 mass % non-volatile component contained in the resin composition. (C) The smear inhibitory component is a particulate rubber.

CITATION LIST

Patent Literature

[PTL 1] JP4148501B
[PTL 2] WO2009/008471
[PTL 3] JP2016-156019A
[PTL 4] JP2004-277460A

SUMMARY OF INVENTION

Meanwhile, printed circuit boards have been broadly used in electronic communication devices, for example, portable electronic devices. In particular, recent trends toward weight saving, thinning, and high functionality in portable electronic communication devices require reductions in noises generated in printed circuit boards. Capacitors are vital for reductions in noises. Such capacitors should preferably be thin and compact enough to be embedded into inner layers of printed circuit boards for achievement of high functionality. The capacitors should also preferably maintain stable capacitances even in severe environments under high temperature and high humidity.

In order to achieve high functionality of electronic communication devices, for example, portable electronic devices, it is preferred to control a decrease in capacitance or dielectric constant of a capacitor embedded in a printed circuit board under high temperature and high humidity. For this purpose, a further improvement in the resin layer or dielectric layer of a capacitor is required. High adhesion is also preferred between the resin layer and a circuit (i.e., the adhesion of the resin layer to the circuit).

The inventors have discovered the following fact: a resin composition comprising an epoxy resin, an active ester resin, an aromatic polyamide resin, and a dielectric filler can he used as a dielectric layer of a capacitor. A decrease in capacitance or dielectric constant under high temperature and high humidity can be controlled while high adhesion of the dielectric layer to a circuit is ensured.

An object of the present invention is to provide a resin composition for use in a dielectric layer of a capacitor in which the composition can reduce a decrease in capacitance or dielectric constant under high temperature and high humidity and ensures high adhesion of the dielectric layer to a circuit.

An aspect of the present invention provides a resin composition including a resin component and a dielectric filler. The resin component includes an epoxy resin, an active ester resin, and an aromatic polyamide resin.

Another aspect of the invention provides a resin-coated copper foil including a copper foil and the resin composition. The resin composition is provided on at least one side of the copper foil.

Another aspect of the invention provides a dielectric layer composed of the resin composition that is cured.

Another aspect of the invention provides a copper-clad laminate comprising, in sequence, a first copper foil, the dielectric layer, and a second copper foil.

Another aspect of he invention provides a capacitor device comprising the dielectric layer.

Another aspect of the invention provides a capacitor-embedded printed circuit board comprising the dielectric layer.

BRIEF DESCRIPTION OF THE DRAWINGS

FIG. 1 illustrates a process of manufacturing a resin-coated copper foil, a copper-clad laminate, and a circuit for evaluation in Examples 1 to 8.

DESCRIPTION OF EMBODIMENT

Embodiments of the present invention will now be described. It should be noted that the numerical range expressed by "X to Y" herein represents "X or more and Y or less".

Resin Composition

A resin composition according to the present invention comprises a resin component and a dielectric filler. This resin component further comprises an epoxy resin, an active ester resin, and an aromatic polyamide resin. The resin composition, comprising the epoxy resin, the active ester resin, the aromatic polyimide resin, and the dielectric filler, can be used in a dielectric layer of a capacitor to ensure high adhesion of the dielectric layer to a circuit without a decrease in capacitance or dielectric constant of the capacitor under high temperature and high humidity. The dielectric layer, comprising the resin composition according to the invention, has a high intrinsic capacitance. This capacitance is unlikely to decrease even under high temperature and high humidity. The dielectric layer, comprising the resin composition according to the invention, is unlikely to cause migration of the constituents, which are typically metals, such as Cu, in the circuit even under high temperature and high humidity. Since the interlayer insulation properties can be maintained for a prolonged period, the dielectric constant and thus the capacitance of the dielectric layer is unlikely to decrease under high temperature and high humidity. Furthermore, the dielectric layer, comprising the resin composition according to the invention, has high adhesion to the circuit and is unlikely to cause peeling from the circuit.

The resin composition according to the present invention preferably comprises 9 to 85 parts by weight of aromatic polyamide resin and 5 to 50 parts by weight of active ester resin, preferably 10 to 80 parts by weight of aromatic polyamide resin and 10 to 40 parts by weight of active ester resin, more preferably 15 to 70 parts by weight of aromatic polyamide resin and 12 to 38 parts by weight of active ester resin, more preferably 25 to 60 parts by weight of aromatic polyamide resin and 15 to 35 parts by weight of active ester resin, particularly preferably 30 to 50 parts by weight of aromatic polyamide resin and 20 to 30 parts by weight of active ester resin, based on 100 parts by weight of resin component. Such contents of aromatic polyamide resin and the active ester resin can more efficiently produce the above-mentioned advantageous effects of the present invention.

Any epoxy resin having two or more epoxy groups per molecule and usable for electric and electronic materials can be used. Examples of the epoxy resin include bisphenol A epoxy resins, bisphenol F epoxy resins, bisphenol S epoxy resins, phenol novolak epoxy resins, biphenyl novolak epoxy resins, cresol novolak epoxy resins, alicyclic epoxy resins, glycidyl amine epoxy resins, naphthalene epoxy resins, anthracene epoxy resins, dicyclopentadiene epoxy resins, and any combination thereof. From the viewpoint of ensuring high heat resistance of the cured product, aromatic epoxy resins or polyfunctional epoxy resins are preferred, and phenol novolak epoxy resins, naphthalene epoxy resins, cresol novolak epoxy resins and biphenyl novolak epoxy resins are more preferred. Such epoxy resins after being cured effectively hold the heat resistance of the dielectric layer.

The active ester resin series as a curing agent that reacts to cure the epoxy resin. Any known active ester resin may be used. For example, active ester compounds disclosed in PTL 4 (JP2004-277460A) may be used. Commercially available active ester compounds may also be used. Examples of such commercially available active ester compounds include active ester curing agents having dicyclopentadienyl structures, active ester curing agents having naphthalene skeletons, active ester curing agents comprising acetylated phenol novolak, and active ester curing agents comprising benzoylated phenol novolak, preferably, active ester curing agents having naphthalene skeletons and active ester curing agents having dicyclopentadienyl diphenol structures. Examples of active ester curing agents having dicyclopentadienyl diphenol structures include EXB9451, EXB9460, EXB9460S, and HPC-8000-65T (available from DIC Corporation). Examples of active ester curing agents having naphthalene skeletons include EXB9416-70BK (available from DIC Corporation). Examples of active ester curing agents comprising acetylated phenol novolak include DC808 (available from Mitsubishi Chemical Corporation). Examples of the active ester curing agents comprising benzoylated phenol novolak include YLH1026 (available from Mitsubishi Chemical Corporation). The active ester resins as described above can ensure the heat resistances of epoxy resins after being cured while reducing the water absorption.

In the case that the resin composition comprises 25 to 60 parts by weight of aromatic polyamide resin and 15 to 35 parts by weight of active ester resin based on 100 parts by weight of resin component, the content of the active ester resin is preferably 0.75 to 1.25 equivalents of hydroxy groups for 1 equivalent of epoxy group of the epoxy resin. The active ester resin in a content of 0.75 equivalents or more relative to the epoxy resin is unlikely to cause self-polymerization of the epoxy resin and can prevent the termination of the curing reaction due to a reduced number of epoxy resin molecules. Thus, no hydroxyl group contained in the active ester resin remains, resulting in a dielectric layer having a high dielectric loss tangent. The active ester resin in a content of 1.25 equivalents or less relative to the epoxy resin is unlikely to produce unreacted active ester resin in the dielectric layer after being cured and can prevent poor heat resistance characteristics.

The aromatic polyamide resin contributes to an improvement in heat resistance of the resin layer. The aromatic polyamide resin is synthesized by polycondensation of an aromatic diamine and a dicarboxylic acid. Examples of the aromatic diamine used for the polycondensation include 3,4'-diaminodiphenyl ether, 4,4'-diaminodiphenyl ether, 4,4'-diaminodiphenylmethane, 3,3'-diaminodiphenylsulfone, m-xylenediamine, 3,3'-oxydianiline, and any combination thereof. Examples of the dicarboxylic acid used for the polycondensation include oxalic acid, malonic acid, succinic acid, glutaric acid, adipic acid, pimelic acid, suberic acid, azelaic acid, sebacic acid, phthalic acid, isophthalic acid, terephthalic acid, fumaric acid, and any combination thereof. Aromatic dicarboxylic acids are particularly preferred from the viewpoint of imparting high heat resistance to the aromatic polyamide resin. Examples of the aromatic dicarboxylic acid include phthalic acid, isophthalic acid, terephthalic acid, fumaric acid, and combination thereof. In particular, aromatic polyamide resins containing phenolic hydroxyl groups in the molecules are preferred. In addition, the aromatic polyamide resins may have chemical bonds which impart flexibility to the aromatic polyamide resin chain to such an extent that heat resistance is not impaired. The aromatic polyamide resins may be partially present in aggregated states in the form of crosslinkable polymer alloys with the polyamide resins. Examples of the compound giving a chemical bond that imparts flexibility to the aromatic polyamide resin include butadiene, ethylene-propylene copolymers, styrene-butadiene copolymers, carboxylic acid-butadiene copolymers, acrylonitrile-butadiene copolymers, polyurethanes, polychloroprene, and siloxanes. The aromatic polyamides described above can ensure the flexibility of the epoxy resin after being cured and improve the reliability in peel strength while enhancing the heat resistance.

In order to promote reaction of the resin, a curing accelerator is preferably added to the resin component. Preferred examples of the curing accelerators include imidazole curing accelerators and amine curing accelerators. The content of the curing accelerator is preferably 0.01 to 3 mass %, more preferably 0.1 to 2 mass % based on 100 mass % non-volatile component contained in the resin composition from the viewpoint of the stability in preservation of the resin composition and the efficiency in curing.

The imidazole curing accelerator after curing reaction with the epoxy resin is taken into the molecular structure as part of the epoxy resin without being released in the form of ions, resulting in improved dielectric characteristics and insulation reliability of the resin layer. The content of the imidazole curing accelerator is not restricted. The amount for desirable curing can be appropriately determined in view of various conditions, such as composition of the resin layer. Examples of imidazole curing accelerators include 2-undecylimidazole, 2-heptadecylimidazole, 2-ethyl-4-methylimidazole, 2-phenyl-4-methylimidazole, 1-cyanoethyl-2-undecylimidazole, 1-cyanoethyl-2-ethyl-4-methyl-imidazole, 2-ethyl-4-methylimidazole, 1-cyanoethyl-2-phenylimidazole, 2-phenyl-4,5-dihydroxymethylimidazole, 2-phenyl-4-methyl-5-hydroxymethylimidazole, 2-methylimidazole, 1,2-dimethylimidazole, 2-phenylimidazole, 1-benzyl-2-methylimidazole, 1-benzyl-2-methylimidazole, 1-benzyl-2-phenylimidazole, 1-cyanoethyl-2-methylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2,3-dihydro-1H-pyrrolo[1,2-a]benzimidazole, 1-dodecyl-2-methyl-3-benzylimidazolium chloride, 2-methylimidazoline, 2-phenylimidazoline, and any combination thereof. Preferred examples of imidazole curing accelerators include 2-methylimidazole, 2-ethyl-4-methylimidazole, 2-phenyl-4-methylimidazole, and 2-phenyl-4-methyl-5-hydroxymethylimidazole. Among them, more preferred examples are imidazole curing accelerators having a phenyl group, such as 2-phenyl-4-methylimidazole and 2-phenyl-4-methyl-5-hydroxymethylimidazole, from the viewpoint of chemical stability in a semi-cured (B stage) of the resin layer. Among them, 2-phenyl-4-methyl-5-hydroxymethylimidazole is particularly preferred.

Examples of amine curing accelerators include trialkylamine, such as triethylamine and tributylamine, 4-dimethylaminopyridine, benzyldimethylamine, 2,4,6,-tris(dimethylaminomethyl)phenol, 1,8-diazabicyclo(5,4,0)-undecene, and any combination thereof.

A dielectric filler is a component imparting a preferable high capacitance to the dielectric layer composed of the resin composition. Any known dielectric filler may be used. A preferred dielectric filler comprises at least one selected from the group consisting of $BaTiO_3$, $SrTiO_3$, $Pb(Zr,Ti)O_3$, $PbLaTiO_3$, $PbLaZrO$, and $SrBi_2Ta_2O_9$. A dielectric layer containing a dielectric filler containing $BaTiO_3$ is particularly preferred because it serves as a capacitor with a high capacitance. The content of the dielectric filler in the resin composition is preferably 60 to 95 parts by weight, more preferably 70 to 90 parts by weight, more preferably 70 to 80 parts by weight based on 100 parts by weight of solid content of the resin composition.

The resin composition may further comprise an optional filler dispersant. The filler dispersant can enhance the dispersion of the dielectric filler when a resin varnish is kneaded with the dielectric filler. Any known filler dispersant may be appropriately used. Examples of the preferred filler dispersants include ionic dispersants, e.g., phosphonic, cationic, carboxylic, and anionic dispersants; and nonionic dispersants, e.g., ether, ester, sorbitan ester, diester, monoglyceride, ethylene oxide adducts, ethylenediamine, and phenol dispersants. Other examples of the filler dispersants include coupling agents, such as silane coupling agents, titanate coupling agents, and aluminate coupling agents.

Resin-Coated Copper Foil

The resin composition according to the present invention is preferably used in resin-coated copper foils. The resin composition for resin-coated copper foils is preferably semi-cured because two resin-coated copper foils are laminated such that the layers of the resin composition face each other in the formation of a dielectric layer. The resin-coated copper foil in this form permits efficient production of capacitor devices and capacitor-embedded printed circuit boards without separate formation of resin layers or dielectric layers. In other words, a preferred embodiment according to the present invention provides a resin-coated copper foil including a copper foil and a layer of a resin composition provided on at least one side of the copper foil. The resin composition is typically in the form of a layer. The copper foil may be coated with the resin composition by gravure coating and dried such that the resin layer on the copper foil has a predetermined dried thickness. A resin-coated copper foil is thereby prepared. Any coating technique other than gravure coating, such as die coating and knife coating, may be employed. In addition, coating of the resin composition using a doctor blade and a bar coater may be employed, As long as a desired capacitance can be ensured after the resin layer or dielectric layer is integrated into a capacitor, the resin layer may have any thickness. The resin layer has a thickness of preferably 0.1 to 15 μm, more preferably 0.2 to 10 μm, more preferably 0.5 to 5.0 μm. The resin layer having a thickness within these ranges is advantageous in that such a thickness readily achieves a high capacitance, allows ready formation of the resin layer by application of the resin composition, and readily ensures sufficient adhesion to the copper foil.

The copper foil may be a metal foil as electrodeposited or rolled (so-called raw foil), or may be surface-treated foil at least one surface of which is treated. Various surface treatments may be employed for improving the properties (for example, rust-proofing resistance, moisture resistance, chemical resistance, acid resistance, heat resistance, and adhesion to the substrate) of the surface of the metal foil or imparting these properties to the surface of the metal foil. The surface treatment may be performed on one surface or two surfaces of the metal foil. Examples of the surface treatment on the copper foil include rust-proofing treatment, silane treatment, roughening treatment, and barrier-forming treatment.

The surface, adjacent to the resin layer, of the copper foil has a ten-point average roughness Rzjis of preferably 2.0 μm or less, more preferably 1.5 μm or less, more preferably 1.0 μm or less, particularly preferably 0.5 μm or less, measured in accordance with JIS B 0601-2001. The roughness in such ranges can reduce the thickness of the resin layer. The lower limit of the ten-point average roughness Rzjis of the surface, adjacent to the resin layer, of the copper foil is not defined. From the viewpoint of improving the adhesion to the resin layer, Rzjis is preferably 0.005 μm or more, more preferably 0.01 μm or more, still more preferably 0.05 μm or more.

The copper foil has any thickness, preferably a thickness of 0.1 to 100 μm, more preferably 0.5 to 70 μm or less, more preferably 2 to 70 μm or less, particularly preferably 10 to 70 μm or less, most preferably 10 μm to 35 μm or less. The copper foil having a thickness within such a range allows adoption of a common patterning processes for wiring on printed circuit board including MSAP (modified semi-additive process), SAP (semi-additive process), and subtractive process. However, in such a case as the copper foil has a thickness of 10 μm or less, the resin-coated copper foil of the present invention may be prepared by forming a resin layer on the copper foil surface of a copper foil with a carrier having a release layer in order to improve the handling properties.

Dielectric Layer

The resin composition according to the present invention is preferably cured into a dielectric layer. In other words, a preferred embodiment according to the present invention provides a dielectric layer composed of the resin composition according to the present invention that is cured. The resin composition may be cured by any known technique, preferably hot vacuum pressing. As long as a desired capacitance can be ensured, the dielectric layer may have any thickness. The dielectric layer has a thickness of preferably 0.2 to 30 μm, more preferably 0.5 to 20 μm, further preferably 1 to 8 μm, most preferably 2 to 6 μm. The resin layer having a thickness within these ranges is advantageous in that such a thickness readily achieves a high capacitance, allows ready formation of the resin layer by application of the resin composition, and readily ensures sufficient adhesion to the copper foil.

Copper-Clad Laminate

The resin composition according to the present invention or the dielectric layer composed of the resin composition is preferably applied to a copper-clad laminate. In other words, a preferred embodiment according to the present invention provides a copper-clad laminate including a first copper foil, the above-mentioned dielectric layer, and a second copper foil in sequence. The copper-clad laminate in this form permits production of preferred capacitor devices and capacitor-embedded printed circuit boards including the dielectric layer composed of the resin composition according to the present invention. The copper-clad laminate may be produced by any method. For example, the copper-clad laminate can be produced by laminating two resin-coated copper foils such that the resin layers face each other and curing the resin layers by hot vacuum pressing.

Capacitor Device and Capacitor-Embedded Printed Circuit Board

The resin composition according to the present invention or the dielectric layer comprising the resin composition is preferably integrated into a capacitor device. In other words, a preferred embodiment according to the present invention provides a capacitor device including the above-mentioned dielectric layer. The capacitor device may have any configuration including a known configuration. A particularly preferred embodiment is a capacitor-embedded printed circuit board including an inner layer integrated with the dielectric layer serving as a capacitor. In other words, the particularly preferred embodiment according to the present invention provides a capacitor-embedded printed circuit board including the aforementioned dielectric layer. Specifically, the resin-coated copper foil according to the invention permits efficient production of capacitor devices and capacitor-embedded printed circuit boards by a known technique.

EXAMPLES

The present invention will now be described in more detail in reference to the following examples.

Examples 1 to 7

(1) Preparation of Resin Varnish

Resins, an imidazole curing accelerator, and a dielectric filler were prepared as raw materials for resin varnishes, which will be described below.

Epoxy resin: biphenyl novolak epoxy resin NC-3000 available from Nippon Kayaku Co. Ltd.

Active ester resin: HFC-8000-65T available from DIC Corporation

Aromatic polyamide resin: BPAM-155 available from Nippon Kayaku Co. Ltd.

imidazole curing accelerator: 2P4MHZ available from Shikoku Chemicals Corporation (1.0 wt % was added based on 100 wt % resin component)

Dielectric filler: $BaTi_3$; AKBT-M available from Nippon Chemical Industry Co., Ltd.

Filler dispersant: titanate coupling agent; KR-44 available from Ajinomoto Fine-Techno Co., Ltd.

Raw materials for resin varnishes were weighed and mixed in the proportion by weight in each example shown in Table 1. Cyclopentanone as a solvent was added to each mixture and stirred at 60° C. The transparencies of the resulting resin varnishes were confirmed, and then the resin varnishes were stocked.

(2) Kneading of Resin Varnish with Filler

Cyclopentanone, a dielectric filler, and a filler dispersant were weighed. The weighed solvent, dielectric filler and filler dispersant were slurried with a disperser. Slurrying of the dielectric filler and the filler dispersant was confirmed. Each resin varnish was then weighed and kneaded into the slurry comprising the dielectric filler with the disperser to yield a resin composition 4.

(3) Coating with Resin

As illustrated in FIG. 1, the resultant resin composition 4 was applied to a copper foil 2 (available from Mitsui Mining & Smelting Co., Ltd. and having a thickness of 35 μm and a surface roughness Rz of 0.5 μm) with a bar coater such that the layer of the resin composition had a thickness of 1.5 μm. The copper foil was subsequently dried in an oven heated to 130° C. for 3 minutes to semicure the resin composition. A resin-coated copper foil 6 was thereby prepared.

(4) Press

As illustrated in FIG. 1, two resin-coated copper foils 6 were laminated such that the layers of the resin composition 4 faced each other. This laminate was subjected to vacuum press at a pressure of 40 kgf/cm$^2$ and 200° C. for 90 minutes. The resin composition 4 was cured thereby. In this manner, a copper-clad laminate 8 including a dielectric layer composed of the cured resin composition 4 was prepared.

(5) Formation and Test of Circuit Pattern

One or two sides of each resultant copper-clad laminate 8 were etched for formation of a circuit 10 for various tests. The following tests were performed.

<Test 1: Peel Strength>

One side of each copper-clad laminate was etched for formation of a linear circuit pattern with a width of 10 mm. The circuit pattern was then peeled with a autograph tensile tester at a peeling rate of 50 mm/minute for measurement of the peel strength. The peel strength was measured in accordance with IPC-TM-650 2.4.8. Measured peel strengths were evaluated based on the following criteria:

Rating A: 0.8 kgf/cm or more (good)

Rating B: 0,4kgf/cm or more and less than 0.8 kgf/cm (acceptable)

Rating C: Less than 0.4 kgf/cm (unacceptable)

The results are as shown in Table 1.

<Test 2: Rate of Decline in Capacitance after Heat Treatment>

One side of each copper-clad laminate was etched for formation of a circular circuit pattern with a diameter of 0.5 inches (12.6 mm). Then capacitance of the copper-clad laminate was measured at a frequency of 1 kHz with an LCR meter (LCR High Tester 3532-50 available from Hioki E.E. Corporation) in accordance with IPC-TM-650 2.5.2. The results are as shown in Table 1.

Samples that had been subjected to the measurement were heated at 230° C. for 110 minutes in an oven. The capacitances of the samples were remeasured. The rates of decline in capacitance were calculated. The calculated rates of decline in capacitance were evaluated based on the following criteria:

Rating AA: Less than 2% (best)
Rating A: 2% or more and less than 3% (better)
Rating B: 3% or more and less than 6% (acceptable)
Rating C: 6% or more (unacceptable)
The results are as shown in Table 1.

<Test 3: Retention time of Interlayer Insulation Properties>

Two sides of each copper-clad laminate were etched for formation of a circular circuit pattern with a diameter of 0.5 inches (12.6 mm). Upper and lower electrodes of the circuit pattern were then soldered to lines, which were then connected to a tester for measurement of migration of ionized Rating C: rating C in at least one test (unacceptable)
The results are as shown in Table 1.

Example 8 (Comparative)

A resin varnish was prepared and evaluated as in Example 3 except that 20.0 parts by weight of phenolic resin (MEH-7500 available from Meiwa Plastic Industries, Ltd.) was used instead of the active ester resin and the content of epoxy resin in the proportion increased to 40.0 parts by weight. The results are as shown in Table 1.

Example 9 (Comparative)

A resin varnish was prepared and evaluated under the same conditions as in Example 2 except that a butyral resin (KS-5Z available from Sekisui Chemical Co., Ltd.) was used instead of the aromatic polyamide resin. The results are as shown in Table 1.

Example 10 (Comparative)

A resin varnish was prepared and evaluated under the same conditions as in Example 1 except that the aromatic polyamide resin was not used and the contents of the epoxy resin and the active ester resin in the proportion increased to 56,0 parts by weight and 44.0 parts by weight, respectively. The results are as shown in Table 1.

TABLE 1

| | | | | Ex. 1 | Ex. 2 | Ex. 3 | Ex. 4 | Ex. 5 | Ex. 6 | Ex. 7 | Ex. 8* | Ex. 9* | Ex. 10* |
|---|---|---|---|---|---|---|---|---|---|---|---|---|---|
| Resin composition | Resin components and proportion based on 100 parts by weight | Epoxy resin | NC-3000 | 52.0 | 46.0 | 32.0 | 34.0 | 28.0 | 22.0 | 18.0 | 40.0 | 46.0 | 56.0 |
| | | Active ester resin | HPC-8000-65T | 38.0 | 34.0 | 30.0 | 26.0 | 22.0 | 18.0 | 12.0 | — | 34.0 | 44.0 |
| | | Phenolic resin | MEH-7500 | — | — | — | — | — | — | — | 20.0 | — | — |
| | | Aromatic polyamide resin | BPAM-155 | 10.0 | 20.0 | 30.0 | 40.0 | 50.0 | 60.0 | 70.0 | 40.0 | — | — |
| | | Butyral resin | KS-5Z | — | — | — | — | — | — | — | — | 20.0 | — |
| | Content of dielectric filler based on 100 parts by weight of overall solid content of resin composition | | | 80.0 | 80.0 | 80.0 | 80.0 | 80.0 | 80.0 | 80.0 | 80.0 | 80.0 | 80.0 |
| Results | Peel strength (kgf/cm) and rating | | | 0.6 | 0.7 | 0.8 | 0.9 | 1.0 | 1.1 | 1.2 | 6.4 | 0.7 | 0.2 |
| | | | | B | B | A | A | A | A | A | A | B | C |
| | Capacitance (nF/in$^2$) | | | 39 | 40 | 41 | 42 | 43 | 44 | 45 | 44 | 34 | 30 |
| | Rate of Decline in capacitance (%) and rating | | | 2.0 | 2.0 | 2.2 | 2.5 | 2.8 | 3.0 | 3.0 | 10.0 | 2.5 | 2.0 |
| | | | | A | A | A | A | A | B | B | C | A | A |
| | Retention time of interlayer insulation properties (hr) | | | 300 | 600 | >1000 | >1000 | 800 | 700 | 400 | 150 | 100 | 50 |
| | | | | B | A | AA | AA | A | A | B | C | C | C |
| | Overall rating | | | B | A | AA | AA | AA | A | B | C | C | C |

*denotes comparative examples.

copper. The circuit pattern was placed in a chamber having a temperature of 85° C. and a humidity of 85% RH. The retention time while the dielectric resistance of a circuit was maintained at $1\times10^5 \Omega$ or more was measured at an applied voltage of 3 V. The retention time of the interlayer insulation properties was evaluated based on the following criteria:

Rating AA: 1000 hours or more (best)
Rating A: 500 hours or more and less than 1000 hours (good)
Rating B: 200 hours or more and less than 500 hours (acceptable)
Rating C: Less than 200 hours (unacceptable)
The results are as shown in Table 1.

<Overall Rating>

The overall rating was determined from the results of Tests 1 to 3 based on the following criteria:
Rating AA: rating A or AA in all the tests (best)
Rating A: rating A or AA in two tests and no rating C (good)
Rating B: rating A or AA in one test and no rating C (acceptable)

The invention claimed is:
1. A resin composition comprising
a resin component and
a dielectric filler,
wherein the resin component comprises
an epoxy resin composed of a biphenyl novolak epoxy resin,
an active ester resin, which is a curing agent that reacts to cure the epoxy resin, and
an aromatic polyamide resin containing a phenolic hydroxyl group;
wherein 100 parts by weight of the resin component comprises 22 to 46 parts by weight of the epoxy resin, 20 to 60 parts by weight of the aromatic polyamide resin and 18 to 34 parts by weight of the active ester resin,
wherein the resin composition has an insulation retention time of 500 hours or more, and
wherein the insulation retention time is determined by etching two sides of a copper clad laminate including a dielectric layer composed of the resin composition in cured state to form a circular circuit pattern with a diameter of 0.5 inches, soldering lines to upper and lower electrodes of the circuit pattern, connecting the lines to a tester for measurement of migration of ionized copper, placing the circular circuit pattern in a chamber having a temperature of 85° C. and a humidity of 85% RH, and applying a voltage of 3 V to the circular circuit pattern to measure time while a dielectric resistance is maintained at $1 \times 10^5 \Omega$ or more.

2. The resin composition according to claim 1, wherein the dielectric filler comprises at least one selected from the group consisting of $BaTiO_3$, $SrTiO_3$, $Pb(Zr,Ti)O_3$, $PbLaTiO_3$, $PbLaZrO$, and $SrBi_2Ta_2O_9$.

3. The resin composition according to claim 1, wherein the dielectric filler is $BaTiO_3$.

4. The resin composition according to claim 1, wherein 100 parts by weight of the solid content of the resin composition comprises 60 to 95 parts by weight of the dielectric filler.

5. A resin-coated copper foil comprising a copper foil and the resin composition according to claim 1, wherein the resin composition is provided on at least one side of the copper foil.

6. A dielectric layer composed of the resin composition according to claim 1 that is cured.

7. The dielectric layer according to claim 6, wherein the dielectric layer has a thickness of 0.2 to 30 μm.

8. A copper-clad laminate comprising, in sequence, a first copper foil, the dielectric layer according to claim 6, and a second copper foil.

9. A capacitor device comprising the dielectric layer according to claim 6.

10. A capacitor-embedded printed circuit board comprising the dielectric layer according to claim 6.

* * * * *